United States Patent
Rossi

(10) Patent No.: US 10,403,671 B2
(45) Date of Patent: Sep. 3, 2019

(54) WAFER-LEVEL OPTICAL MODULES AND METHODS FOR MANUFACTURING THE SAME

(71) Applicant: ams Sensors Singapore Ptd. Ltd., Singapore (SG)

(72) Inventor: Markus Rossi, Jona (CH)

(73) Assignee: ams Sensors Singapore Pte. Ltd., Singapore (SG)

(*) Notice: Subject to any disclaimer, the term of this patent is extended or adjusted under 35 U.S.C. 154(b) by 0 days.

(21) Appl. No.: 15/100,535

(22) PCT Filed: Dec. 8, 2014

(86) PCT No.: PCT/SG2014/000583
§ 371 (c)(1),
(2) Date: May 31, 2016

(87) PCT Pub. No.: WO2301/508844
PCT Pub. Date: Jun. 18, 2015

(65) Prior Publication Data
US 2016/0300876 A1    Oct. 13, 2016

Related U.S. Application Data

(60) Provisional application No. 61/913,995, filed on Dec. 10, 2013.

(51) Int. Cl.
*H01L 27/146* (2006.01)
*H01L 25/00* (2006.01)
(Continued)

(52) U.S. Cl.
CPC .... *H01L 27/14636* (2013.01); *H01L 25/0657* (2013.01); *H01L 25/50* (2013.01);
(Continued)

(58) Field of Classification Search
CPC ....... H01L 27/00; H01L 27/01; H01L 27/013; H01L 27/016; H01L 27/02;
(Continued)

(56) References Cited

U.S. PATENT DOCUMENTS 5,912,872 A * 6/1999 Feldman .............. G02B 6/4231
369/103
8,045,159 B2   10/2011 Egloff et al.
(Continued)

FOREIGN PATENT DOCUMENTS

CN    101730863 A    6/2010
CN    102129106 A    7/2011
(Continued)

OTHER PUBLICATIONS

Tang, The optical module manufacturing method, 2013, machine translation of CN 102129106 on Aug. 25, 2017, pp. 1-11.*
(Continued)

*Primary Examiner* — Natalia A Gondarenko
(74) *Attorney, Agent, or Firm* — Fish & Richardson P.C.

(57) ABSTRACT

The method for manufacturing a plurality of optical modules each comprising a first (C1) and a second (C2) optical component comprises the steps of a) providing a first substrate wafer (S1) on which a plurality of the first optical components (C1) is present on a top side of the first substrate wafer; b) providing a second substrate wafer (S2) having a material region which is a continuous laterally defined region in which material of the second substrate is present, wherein a plurality of the second optical components (C2) is present in said material region; c) achieving a lateral alignment of the first (S1) and second (S2) substrate wafers such that each of the first optical components (C1) is present in a laterally defined region not overlapping said material region; d) interconnecting the first and second substrate wafers in
(Continued)

said lateral alignment such that the top side of the first substrate wafer faces a bottom side of the second substrate wafer with no further wafer in between. This way, first and second optical components may be placed particularly close to each other.

31 Claims, 5 Drawing Sheets

(51) Int. Cl.
| | |
|---|---|
| *H01L 25/065* | (2006.01) |
| *H01L 31/0203* | (2014.01) |
| *H01L 31/054* | (2014.01) |
| *H01L 31/0232* | (2014.01) |
| *H01L 31/09* | (2006.01) |
| *G01S 7/481* | (2006.01) |
| *H01L 23/00* | (2006.01) |
| *H01L 25/075* | (2006.01) |

(52) U.S. Cl.
CPC .. *H01L 27/14625* (2013.01); *H01L 27/14685* (2013.01); *H01L 31/0203* (2013.01); *H01L 31/02327* (2013.01); *H01L 31/09* (2013.01); *G01S 7/481* (2013.01); *H01L 24/94* (2013.01); *H01L 25/0756* (2013.01); *H01L 2924/0002* (2013.01); *H01L 2924/12043* (2013.01); *H01L 2924/12044* (2013.01)

(58) Field of Classification Search
CPC . H01L 27/0203; H01L 27/0207; H01L 27/14; H01L 27/1421; H01L 27/146; H01L 27/14601; H01L 27/14618; H01L 27/14623; H01L 27/14629; H01L 27/14643; H01L 27/14687; H01L 27/1469; H01L 27/14818; H01L 27/14636; H01L 27/14685; H01L 27/14625; H01L 25/043; H01L 25/042; H01L 25/0652; H01L 25/112; H01L 25/162; H01L 25/167; H01L 25/0657; H01L 25/0756; H01L 25/50; H01L 31/09; H01L 2924/12044; H01L 2924/12043; H01L 2924/0002; H01L 33/60; H01L 24/94; H01L 31/0203; H01L 31/0232; H01L 31/02325; H01L 31/048; H01L 31/049; H01L 31/054; H01L 31/0547; H01L 31/0549; H01L 31/153; H01L 31/173; H01L 31/02327; G01S 7/481
USPC ......... 257/432, 89, 77, 98, 99, 91, E33.069, 257/E33.005, E51.022, 80–82; 438/25–35
See application file for complete search history.

(56) References Cited

U.S. PATENT DOCUMENTS

| | | | |
|---|---|---|---|
| 8,362,496 B1* | 1/2013 | Tu | H01L 25/167 257/80 |
| 8,716,739 B2* | 5/2014 | Coffy | H01L 25/167 257/100 |
| 2007/0009223 A1* | 1/2007 | Rudmann | H01L 25/167 385/147 |
| 2010/0295142 A1 | 11/2010 | Washizu | |
| 2011/0050979 A1* | 3/2011 | Rudmann | H01L 27/14623 348/335 |
| 2011/0062478 A1* | 3/2011 | Negley | H01L 33/58 257/98 |
| 2011/0215341 A1* | 9/2011 | Bond | H01L 33/58 257/81 |
| 2011/0266559 A1* | 11/2011 | Zitzlsperger | G01V 8/12 257/84 |
| 2012/0236382 A1 | 9/2012 | Puegner et al. | |
| 2013/0266264 A1 | 10/2013 | Tomita | |
| 2014/0361200 A1 | 12/2014 | Rudmann et al. | |
| 2016/0072023 A1 | 3/2016 | Rudmann et al. | |

FOREIGN PATENT DOCUMENTS

| | | |
|---|---|---|
| TW | 201312706 A | 3/2013 |
| TW | 201342573 A | 10/2013 |
| WO | 2013/010284 | 1/2013 |

OTHER PUBLICATIONS

State Intellectual Property Office of the People's Republic of China, CN Application No. 201480067217.2, dated May 3, 2017, 21 pages (with English translation).

Australian Patent Office, International Search Report for International Patent Application No. PCT/SG2014/000583, dated May 18, 2015.

Lo, J.F. et al., "Wafer-level packaging of three-dimensional moems device with lens diaphragm", IEEE 20th Internal Conference on Micro Electro Mechanical Systems, MEMS, Japan, pp. 715-718 (2007).

* cited by examiner

WAFER-LEVEL OPTICAL MODULES AND METHODS FOR MANUFACTURING THE SAME

The invention relates to the field of optics and more specifically to the manufacture of optical or opto-electronic components. More particularly, it relates to optical modules, in particular opto-electronic modules, and to methods for manufacturing the same and to wafer stacks and devices comprising such modules and to uses related to the method and to the modules. The invention relates to methods and apparatuses according to the opening clauses of the claims.

DEFINITION OF TERMS

"Active optical component": A light sensing or a light emitting component. E.g., a photodiode, an image sensor, an LED, an OLED, a laser chip. An active optical component can be present as a bare die or in a package, i.e. as a packaged component.

"Passive optical component": An optical component redirecting light by refraction and/or diffraction and/or (internal and/or external) reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing (imprinting), casting, molding.

"Wafer": A substantially disk- or plate-like shaped item, its extension in one direction (z-direction or vertical direction or stacking direction) is small with respect to its extension in the other two directions (x- and y-directions or lateral directions). Usually, on a wafer, a plurality of like structures or items may be arranged or provided therein, typically on a rectangular grid. A wafer may have openings or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Lateral": cf. "Wafer"

"Vertical": cf. "Wafer"

"Light": Most generally electromagnetic radiation; more particularly electromagnetic radiation of the infrared, visible or ultraviolet portion of the electromagnetic spectrum.

In WO 2013/010284 A2, optical modules and ways of manufacturing the same are presented. Inside the modules, light travels basically along vertical paths, i.e. along paths along the stacking direction of substrates comprised in the modules. Accordingly, optical components present in the modules are vertically aligned.

From U.S. Pat. No. 8,045,159 B2 optical apparatuses are known, in which light travels along angled paths.

One object of the invention is to create a new way of manufacturing optical modules, in particular on wafer-level. Furthermore, corresponding optical modules and wafer stacks shall be provided as well as devices comprising the optical modules, and uses of the method.

Another object of the invention is to provide particularly miniscule optical modules.

Another object of the invention is to provide a way of mass-producing optical modules with particularly high precision, in particular with a particularly high lateral positioning precision.

Another object of the invention is to provide a way of mass-producing optical modules with a particularly high yield.

Another object of the invention is to provide a way of making possible to have optical components of an optical module located particularly close to each other.

Further objects emerge from the description and embodiments below.

At least one of these objects is at least partially achieved by apparatuses and methods according to the patent claims.

In wafer-level manufacture of optical modules, it is in most cases provided that light paths run vertically, i.e. along the stacking direction, and, accordingly, the optical components are, for each module, arranged one after the other along a vertical line: However, it can also be provided that light paths run inside the module along light paths which are, at least in part, inclined with respect to a vertical direction.

In particular in the latter case, two optical elements per module, a first and a second optical element, may have to be positioned in laterally different regions, and this could be accomplished by having the two optical elements (per module) present at one and the same wafer (and finally, after singulizing, at one and the same substrate). However, the inventors recognized that doing so might be disadvantageous, e.g., in view of positioning tolerances (in particular lateral positioning tolerances) and/or in view of manufacturing methods to be applied and/or if the optical components shall be particularly close to each other (laterally). They realized that it would be possible to distribute the first and the second optical components in such a way that first optical components are present on a first wafer and second optical components are present in or at a second wafer.

E.g., in case each optical module shall comprise as the second optical component a passive optical component, it may be very efficient to produce these by replication on wafer level, more particularly by replicating the passive optical components onto a wafer on which they shall remain still inside the finished optical module. Embossing can be a particularly suitable way of accomplishing replication; using embossing, all second optical components to be provided on or at one wafer can be manufactured in a single embossing process. However, in order to realize particularly small optical modules or specific optical paths (e.g., where the light path or a light path section encloses a rather small non-zero angle with the vertical direction), certain minimum lateral distances between the first and second optical components in one optical module have to be provided. This may mainly be the case, e.g., because for producing the second optical components by replication on a wafer on which the first optical components are already present, a preset minimum distance to the first optical components must be respected and/or preset height limitations for the first optical components must be respected. Or vice versa, in case the second optical components are manufactured by replication on the wafer before the first optical components are present thereon, a preset minimum distance to the second optical components must be respected for placing or producing the first optical components on or at the wafer.

Such problems can be solved or at least mitigated when the first optical components are present on a first wafer, and second optical components are present at a second wafer, in particular before the first and second wafers are interconnected. This can be accomplished either by placing prefabricated optical components on the respective wafer or by producing the optical components directly on the respective wafer, e.g., by replication, or by producing the optical components together with the respective wafer, e.g., using a molding technique.

Furthermore, it may be desirable to avoid that the first optical components are exerted to conditions required for processing the second optical components, e.g., for attaching them to the wafer or for producing them on or with the second wafer, or to conditions required for processing the second wafer, e.g., for attaching another wafer thereto. And, vice versa, it may be desirable to avoid that the second optical components are exerted to conditions required for a corresponding processing of the first optical components or of the first wafer. Corresponding processing steps may comprise the application of heat and/or the application of radiation such as UV radiation.

Also in this case, the potential problems can be avoided by providing that a first and a second wafers are provided, the first wafer bearing the first optical components and the second wafer bearing the second optical components, and a wafer stack is thereafter produced.

Such first and second wafers are (separately) prepared first, and then interconnected, e.g., by bonding them to each other via a bonding agent such as an epoxy resin or by providing a form fit, e.g., a snap fit. Usually, it will be provided that a top side of the first wafer not only faces a bottom side of the second wafer, but that these are as close to each other as enabled by the interconnection method. Said top side of the first wafer usually faces a bottom side of the second wafer without a further component being present in between then, possibly with the exception of a bonding agent.

An advantage of providing a first wafer with first optical components and, separately therefrom, a second wafer with second optical components can be an improved yield during the manufacture of the optical devices. More particularly, before interconnecting first and second wafers, the first and/or the second wafers may be inspected or examined, and merely such first and/or second wafers are used which have reached predetermined (preset) parameters, i.e. which are of sufficient quality, e.g., exhibit appropriate optical properties. And it can, additionally or alternatively, be provided that the second optical components are inspected or examined before interconnecting first and second wafers and that first optical components are mounted or produced on the first wafer in specific locations only, which are selected in dependence of the result of the inspection or examination. E.g., a result of the inspection or examination can be indicative of those specific optical modules (or more particularly of the lateral location of such optical modules) for which applies that the one or more second optical components associated with the respective optical module (i.e. second optical components to be comprised in the respective optical module) reach predetermined (preset) parameters, and first optical components are attached to or produced on the first wafer only in locations associated to those specific optical modules.

Furthermore, one or more conductor paths may be present at or on the top side of the first substrate, more particularly in a laterally defined region in which the second optical component is present in the optical module. Since creating an optical component using replication on a substrate with conductor paths can be difficult, the provision of the second wafer can be advantageous, in particular if replicated second optical components are present at or on the second substrate wafer.

In a specific application, the first optical components are active optical components, and the second optical components are passive optical components. In this case, the first and second wafers are usually different types of wafers, because the first wafer usually will provide electrical connections across its vertical extension and can be, e.g., a printed circuit board, and the second wafer usually does not need such a property and can be, e.g., a wafer predominantly made of glass or of a polymer.

The second wafer has a multitude of openings, e.g., through-holes, providing space for the first optical components required when interconnecting the first and second wafers. When the first and second wafers are interconnected, the first optical components project into or through the openings. Usually, no material of the second wafer is present in a laterally defined region in which a first optical component is located. And usually, also no optical component present at or integrated in the second wafer is present in the laterally defined region in which the first optical component is located.

It is, however, possible to provide that further optical components (different from the first optical components) present at or in the first wafer are located in laterally defined regions in which the second optical components are located, in particular in case the second optical components are transmissive optical components. But this does not need to be the case and is merely an option, and in particular, such further optical components will usually not protrude from the top surface of the first wafer. They would rather be integrated or present in the first wafer and/or be present on or attached to a bottom side of the first wafer (the bottom side being opposite to the top side).

The optical module may in addition comprise a third substrate and a spacer which may be intergrated in or separate from the third substrate. And, accordingly, for the manufacture, a third wafer, more specifically a third substrate wafer, will be provided and optionally also a (separate) spacer wafer. The spacer wafer—to which we will refer as first spacer wafer—interconnects the third substrate wafer and the first and/or the second wafer, and by it, the distance between the third substrate wafer and the first and/or the second wafer is determined. We shall now more specifically refer to the first and second wafers as first and second substrate wafers.

Third optical components, e.g., passive optical components, may and in many cases will be present at the third substrate wafer, e.g., being integrated therein or being attached thereto. In particular in this case, but also in other cases, the second optical components can be reflective optical components.

The first and second substrate wafers are usually already interconnected before connecting the third substrate wafer thereto. But it is also possible to simultaneously interconnect the first, the second and the third substrate wafers.

And it is also possible that another wafer, which will be referred to as second spacer wafer, is present such that in each optical module, another spacer (second spacer) is present. That second spacer wafer either is continuous with the second substrate wafer, e.g., being produced in the same process such as in a molding process, or is attached to the second spacer wafer and more specifically attached to the top side of the second spacer wafer. That spacer usually will not be provided for defining a distance between two wafers (as the first spacer wafer usually does), but rather in order to define or inhibit light paths within each optical module, e.g., functioning as one or more shades or baffles or apertures.

As has been pointed out above, the described use of two (directly) attached substrates or substrate wafers can make possible to position first and second optical components (laterally) particularly close to each other. In particular, it may make possible to have them located closer than possible on a single wafer and/or to have them located closer than possible if the first and/or the second optical components would not be present at or on the respective wafer before interconnecting the wafers.

It is also possible to remove, e.g., cut off, portions of material continuous with respective first or (more typically) second optical components before interconnecting the wafers. Such material can be, e.g., material unavoidably produced when producing the respective optical components, e.g., using a replication technique. Said removing of material may be accomplished in one and the same process with removing material from the respective wafer, in particular with removing material from the respective wafer for creating openings in the respective wafer. Also this can make possible to have first and second optical components located particularly close to each other.

Yet another way of enabling a (laterally) close positioning of the first and second optical components is to structure the second substrate such that it provides an undercut above the top side of the first substrate (when the first and second substrates are interconnected).

Furthermore, in order to have the first and second optical components (usually pair-wise) particularly close to each other, it will be avoided to have present between respective first and second optical components further items, such as further components of the optical module. In particular, no optical component of the optical module and no part of a substrate different from the first and second substrates shall then be present in the space between the respective first and second optical components.

The method can be characterized rather generally as follows, wherein various embodiments and refinements will be described, too.

A method for manufacturing a plurality of optical modules each comprising a first and a second optical component, wherein the method comprises the steps of
a) providing a first substrate wafer on which a plurality of the first optical components is present on a top side of the first substrate wafer;
b) providing a second substrate wafer having a material region which is a continuous laterally defined region in which material of the second substrate is present, wherein a plurality of the second optical components is present in said material region;
c) achieving a lateral alignment of the first and second substrate wafers such that each of the first optical components is present in a laterally defined region not overlapping said material region;
d) interconnecting the first and second substrate wafers in said lateral alignment such that the top side of the first substrate wafer faces a bottom side of the second substrate wafer with no further wafer in between.

As has been described above, there are various possible advantages and effects achievable this way, in particular by having the optical components present on the respective wafers before interconnecting the wafers.

It can be provided that no optical component is present at the second substrate wafer outside the material region, more specifically: no optical component is integrated in or attached at or to, e.g., mounted on, the second substrate wafer outside the material region It is usually provided that the first optical components protrude from top side.

Typically, the first and second optical elements are present at (and contribute to forming) a light path inside a respective optical module, and that light path usually comprises at least one section where it is inclined with respect to a vertical direction, in particular wherein the first and second optical elements are present at (and contribute to forming) one and the same such light path inside the respective optical module. However, the first and second optical components may be present at different light paths inside the optical module.

The material region being a "continuous" laterally defined region is to say that it is an unbroken or single region, and not two or more separate (not interconnected) laterally defined regions.

Usually, the first optical components are nominally identical parts.

Usually, the second optical components are nominally identical parts.

The method may comprise one or both of the steps
a1) providing the first substrate wafer with the plurality of first optical components, e.g., by producing them together with or producing them on or attaching them to the first substrate wafer; and
b1) providing the second substrate wafer with the plurality of second optical components, e.g., by producing them together with or producing them on or attaching them to the first substrate wafer.

In one embodiment, the first optical components protrude from the top side of the first substrate wafer beyond a top side of the second substrate wafer. In other words, the first optical components extend to a vertical level of above the second substrate wafer.

In one embodiment, the second substrate wafer comprises a plurality of open regions which are laterally defined regions in which no material of the second substrate is present, and wherein each of the first optical components is present in one of these open regions.

Typically, each of the open regions is laterally enclosed by the material region.

In one embodiment, the first optical components are laterally positioned in one of a plurality of first regions each, and the second optical components are laterally positioned in one of a plurality of second regions each, wherein none of the first regions overlaps with any one of the second regions. And more particularly, in none of the first regions, an optical element attached at or to or integrated in the second substrate wafer is present.

In one embodiment, the second substrate wafer constitutes an integrally formed part. It is even possible to provide that the second substrate wafer together with the second optical component constitute an integral part, e.g., a part comprising or even substantially consisting of a polymer or of polymers. This may be accomplished, e.g., by producing both in a replication process, e.g., by molding.

In one embodiment, the second substrate wafer is continuous (or integrally formed) with a plurality of protrusions protruding in a direction opposite to a direction pointing from the bottom side of the second substrate wafer to the top side of the first substrate wafer.

Those protrusions can serve as spacers and are usually present in laterally defined regions not overlapping laterally refined regions in which the second optical components are present.

However, it is also possible to provide a separate spacer wafer.

In one embodiment, the method comprises the steps of g) providing a third substrate wafer, wherein on or at the third substrate wafer a plurality of third optical components is present and/or the third substrate wafer comprises a plurality of laterally defined transparent regions; and h) connecting the third substrate wafer to the first substrate wafer and/or the second substrate wafer via a wafer referred to as first spacer wafer, such that the second substrate wafer is arranged between the first substrate wafer and the third substrate wafer, wherein the first spacer wafer is optionally continuous (or integrally formed) with the third spacer wafer;

wherein step h) is carried out after step d) or simultaneously with step d).

In this case, the first spacer wafer is typically arranged between first substrate wafer and third substrate wafer and may more particularly be arranged between the second substrate wafer and the third substrate wafer.

The first spacer wafer may be continuous with the third substrate wafer, in particular they may be continuous (constitute an integrally formed part), but it is also possible to provide that the first spacer wafer and the third substrate wafer are separate parts, in particular separate parts which establish an interconnection not before (but during) step h).

In one embodiment, the first optical components are active optical components and the second optical components are passive optical components. In such "hybrid" packages or "hybrid" optical modules—which also constitute opto-electronic modules—, the first substrate wafer typically is a printed circuit board, in particular one establishing electrical connections across its vertical extension.

In one embodiment, the method comprises the step of r) replicating the second optical components on the second substrate wafer.

Replication techniques can make possible to simultaneously create on one wafer a plurality of optical components such as to simultaneously create all the second optical components of the plurality of second optical components on the second substrate wafer. This can be accomplished using a single replication tool.

By step r), the second optical components may simultaneously be produced and attached to the second substrate wafer, more particularly to a top side thereof.

Usually, step r) is carried out before steps c) and d).

In one embodiment, the method comprises the step of attaching the second optical components to the second substrate wafer. This may be accomplished, e.g., in particular using pick-and-place. The second optical components are in this case usually attached on the top side of the second substrate wafer.

Not only the second optical components may be mounted on a substrate wafer, e.g., using pick-and-place, but also the first optical components may be attached to the first substrate wafer in such a way.

As has been pointed out before, the method can make possible to have optical components located (laterally) closer than otherwise possible. This "otherwise" is expressed in more detail in the following, namely by referring to alternative ways of (attempting) to manufacture such an optical module and to space requirements of manufacturing processes used:

In one embodiment, one of said first optical components is produced together with or produced on or attached to the first substrate wafer in a first specific location and orientation using a first process, and one of said second optical components is produced together with or produced on or attached to the second substrate wafer in a second specific location and orientation using a second process, and said first and second specific locations are mutually laterally distant so closely that space requirements of said first and second processes preclude at least one of to simultaneously produce together with or produce on or attach to the first substrate wafer one of said first optical components in said first specific location and orientation using said first process and produce together with or produce on or attach to the second substrate wafer one of said second optical components in said second specific location and orientation using said second process;

to firstly produce together with or produce on or attach to the first substrate wafer one of said first optical components in said first specific location and orientation using said first process and then produce together with or produce on or attach to the second substrate wafer one of said second optical components in said second specific location and orientation using said second process;

to firstly produce together with or produce on or attach to the second substrate wafer one of second first optical components in said second specific location and orientation using said second process and then produce together with or produce on or attach to the first substrate wafer one of said first optical components in said first specific location and orientation using said first process;

after establishing an interconnection between the first substrate wafer and the second substrate wafer.

In an attempt to express an aspect of this embodiment, one can say that first and second optical components are (laterally) located so close that it is not possible to interconnect the first and second substrate wafers before having the respective optical components present on or at them, provided that corresponding processes, i.e. tools, materials and process parameters, are used. It is not excluded that it might be possible to accomplish the task making use of different processes; but it is likely that such different processes would be more time-consuming or more expensive or more complicated, e.g., processing having smaller tolerances.

The described impossibility is due to space requirements of the processes. Processes for creating or attaching optical components have space requirements, i.e. in the region where a component is created or attached, a preset free space must be present, e.g., for tools used. For example, said first process may require so much space in the region of the first optical component that this space overlaps with the space taken by the second optical component. And/or, vice versa, said second process may require so much space in the region of the second optical component that this space overlaps with the space taken by the first optical component.

The mentioned established interconnection is meant to take place without the plurality of first optical components and/or without the plurality of second optical components present on or at the first and second spacer wafers, respectively; but it may otherwise be accomplished like described in step d), in particular such that the top side of the first substrate wafer faces the bottom side of the second substrate wafer with no further wafer in between. In particular, the mentioned established interconnection is meant to take place without the plurality of first optical components and without the plurality of second optical components present on or at the first and second spacer wafers, respectively.

As has been pointed out before, the method can make possible to have optical components located (laterally) closer than otherwise possible. This "otherwise" is, in another way, expressed in more detail in the following, namely by referring to alternative ways of (attempting) to manufacture a similar an optical module (with first and second optical components present on or at one and the same wafer) and to space requirements of manufacturing processes used:

In one embodiment, one of said first optical components is produced together with or produced on or attached to the first substrate wafer in a first specific location and orientation using a first process, and one of said second optical components is produced together with or produced on or attached to the second substrate wafer in a second specific location and orientation using a second process, and wherein said first and second specific locations are mutually laterally distant so closely that space requirements of said first and second processes preclude at least one of

- to simultaneously produce together with or produce on or attach to one single substrate wafer one of said first optical components in a location and orientation corresponding to said first specific location and orientation using said first process and produce together with or produce on or attach to said one single substrate wafer one of said second optical components in a location and orientation corresponding to said second specific location and orientation using said second process;
- to firstly produce together with or produce on or attach to one single substrate wafer one of said first optical components in a location and orientation corresponding to said first specific location using said first process and then produce together with or produce on or attach to said one single substrate wafer one of said second optical components in a location and orientation corresponding to said second specific location and orientation using said second process;
- to firstly produce together with or produce on or attach to one single substrate wafer one of second first optical components in a location and orientation corresponding to said second specific location using said second process and then produce together with or produce on or attach to said one single substrate wafer one of said first optical components in a location and orientation corresponding to said first specific location and orientation using said first process.

In an attempt to express an aspect of this embodiment, one can say that first and second optical components are (laterally) located so close that it is not possible to manufacture them on a single substrate wafer, provided that corresponding processes, i.e. tools, materials and process parameters, are used. It is not excluded that it might be possible to accomplish the task making use of different processes; but it is likely that such different processes would be more time-consuming or more expensive or more complicated, e.g., processes having smaller tolerances. The one single substrate wafer is, in a way, basically a reference for comparison reasons. It may, e.g., be imagined as a (both-sidedly flat) wafer, and the optical components would be meant to be present on or at the one single wafer in laterally identical distances (and corresponding locations) and identical orientations as they are on the first and second spacer wafer, respectively. However, in order to accomplish having the optical components present in the prescribed way—if at all possible—one or more different processes would be required.

Pertaining to the described impossibility due to space requirements of the processes, the same applies as mentioned above.

In one embodiment, a lateral distance between a specific one of the plurality of first optical components and a specific one of the plurality of second optical components is smaller than 800 µm, more particularly wherein one of the following applies:

- said specific first optical component and said specific second optical component are both active optical components and wherein said lateral distance is smaller than 800 µm, more particularly smaller than 400 µm;
- said specific first optical component and said specific second optical component are both replicated passive optical components and wherein said lateral distance is smaller than 800 µm, more particularly smaller than 500 µm;
- said specific first optical component is an active optical component and said specific second optical component is a replicated passive optical component and wherein said lateral distance is smaller than 800 µm, more particularly smaller than 600 µm, even more particularly smaller than 350 µm.

The method involving the first and second substrate wafers can make possible to have first and second optical components as close as below 1 mm, e.g., as close as below 300 in wafer level mass production.

The distances are usually meant to refer to (closest) edge-to-edge distances.

Active optical components may, e.g., be placed on the wafer using pick-and-place.

Replicated optical components are manufactured using a replication technique such as, e.g., molding or embossing.

In one embodiment, the second optical components are replicated optical components each of which is integrally formed with a surrounding portion at least partially surrounding the respective optical component, each of the surrounding portions being produced in the same replication process as applied during producing the respective second optical component, the method comprising the step of m) creating a plurality of openings in the second substrate wafer;

wherein by carrying out step m), at least a portion of each of the surrounding portions is removed.

The replicated optical components may in particular be lens elements.

It may be provided that all the second optical components and all the surrounding portions are produced in one and the same replication process, e.g., in an embosssing process.

The openings can in particular be created in the laterally defined regions mentioned in step c), or the lateral extensions of the openings comprise the laterally defined regions mentioned in step c). The lateral extensions of the openings can in particular coincide with the before-mentioned open regions.

The method may comprise the step of producing the second optical components using a replication technique. All of the second optical components and all of the surrounding portions may be produced using one and the same replication process.

Step m) may for example be accomplished using at least one of laser cutting, machining, micro-machining, drilling.

It may be provided that sections of lines along which the openings are created pass (and which delimit the openings) through the surrounding portions.

It is noted that "integrally formed" parts (or integral parts) can also be described as being continuous (unbroken) parts and, moreover, as parts being made of the same material, at least where they abut.

The presence of surrounding portions can in particular be due to the way of manufacturing second optical components, e.g., when a replication process such as an embossing process is used for manufacturing the second optical components.

The surrounding portions usually have no or at least no desired optical function in the optical module.

In the embodiment (comprising step m)), openings in the second substrate wafer are usually created after the second optical components are created or attached to or at the second substrate wafer.

However, in general, it can alternatively be provided that the second optical components are created or attached to or at the second substrate wafer only after openings in the second substrate wafer are created.

In one embodiment, conductor paths are present on the top side of the first substrate wafer in the material region. More specifically, the conductor paths can be present in laterally defined regions occupied by second optical components.

This is usually meant to be the case after step d) or in said lateral alignment mentioned in step d).

Since replication onto conductor paths can pose difficulties, this embodiment can be of advantage in particular in case the second optical components are replicated optical components.

In one embodiment, in said lateral alignment mentioned in step d), a space between a first and a second optical component of one and the same optical module is absent any further part or portion of the optical module, at least apart from an optionally present portion of the second substrate wafer and/or from a bonding agent optionally present on the top side of the first substrate wafer.

This way, first and second optical components usually can be positioned closer to each other than in case some item were present between them.

More particularly, it can be provided that there is no further optical component present between a first and a second optical component of one and the same optical module.

It may furthermore be provided that no portion of a further wafer is present (in the space) between the first and second optical component of one and the same optical module.

In one embodiment, the second substrate wafer has a profile with cutting lines inclined with respect to the vertical direction.

In particular it can be provided that an undercut between the second substrate wafer and the top side of the first substrate wafer is established.

The vertical direction refers to the vertical direction defined by the second substrate.

The profile (in a plane comprising the vertical) may be such that the lower edge (which is closer to the first substrate wafer, at the bottom side of the second substrate wafer) protrudes less into an opening in the second substrate wafer than the upper edge (at the top side of the second substrate wafer).

This can make possible to position first and second optical components very close to each other.

A singularizing step (or dicing step) may be carried out in order to obtain individual (singulized) optical modules from a wafer stack.

The use is a use of a method described in here (cf. in particular above), for reducing a lateral distance between first and second optical components of one and the same optical module or for achieving a lateral distance between first and second optical components of one and the same optical module which is smaller than achievable using a single substrate wafer only on which the first and second optical components are present due to corresponding processing and in corresponding locations and orientations.

In other words, by making use of two substrate wafers, in particular as described above, optical components can be (laterally) so close to each other as cannot be achieved on only a single wafer (instead of the proposed two interconnected ones), provided that no other techniques for attaching or producing the optical components are used on the single wafer.

Thus, the described methods can be used for accomplishing that first and second optical components of one and the same optical module are located at a mutual distance which is particularly small, namely smaller than achievable in case only a single wafer would be used for both, the first and the second optical components.

And furthermore, the distance can also be smaller than in case of producing together with or producing on or attaching to the first and second substrate wafer, respectively, the first and second optical components, respectively, after interconnecting the first and second substrate wafers (cf. step d) above).

The invention also comprises optical modules.

The optical module comprises a first substrate having a top side on which a first optical component is present;

a second substrate having a bottom side;

wherein the first substrate and the second substrate are interconnected such that the top side of the first substrate faces the bottom side of the second substrate and the second substrate is stacked onto the first substrate in a direction referred to as vertical direction;

wherein the second substrate has a material region which is a laterally defined region in which material of the second substrate is present and in which a second optical component is present; and at least one open region which is a laterally defined region in which no material of the second substrate is present;

wherein the first optical component is laterally located within the open region.

"Lateral" refers to directions perpendicular to the vertical direction.

The second substrate is in particular laterally shaped to leave open space for the first optical component.

The material region and the open region usually are meant to complement to a lateral region occupied by the first substrate and/or to a lateral region occupied by the optical module.

Usually, the second substrate has no more than a single continuous material region.

Typically, the second optical component is present at, e.g., on or in, the second substrate. E.g., the second optical component is mounted on a top side of the second substrate, wherein said top side is opposite to the bottom side of the second substrate; or the second optical component is integrated in or attached to the second substrate, e.g., at least partially located vertically between top and bottom side of second substrate.

The interconnection between the first substrate and the second substrate may be accomplished, e.g., by bonding or by providing a form-fitting connection.

In one embodiment, the first optical component is laterally positioned in a first region and the second optical component is laterally positioned in a second region, wherein the first region and the second region do not overlap.

In one embodiment, the optical module further comprises a third substrate and a first spacer, wherein the first spacer is present between the first substrate and the third substrate, more particularly between the second substrate and the third substrate, and wherein the first spacer is optionally continuous with, e.g., integrally formed with, the third substrate.

In one embodiment, the optical module comprises a second spacer, the second spacer extending from a top side of the second substrate opposite to the bottom side of the second substrate into a direction opposite to a direction pointing from the bottom side of the second substrate to the top side of the first substrate, wherein the second spacer is optionally continuous, in particular integrally formed with, the second substrate.

In one embodiment referring to the two last-addressed embodiments, the second spacer is at a distance from the third substrate.

In one embodiment, no part or component of the optical module is present between the first and the second optical component, at least apart from an optionally present portion of the second substrate and/or from a bonding agent optionally present on the top side of the first substrate.

More particularly, it can be provided that no part or component of the module is present between the first and second optical components on the top side of the first substrate or on a top side of the second substrate; again possibly except an optionally present bonding agent.

The top side of the second substrate is opposite to the bottom side of the second substrate.

Similarly, one can say that a space between the first and second optical components is absent any part or component of the optical module, except possibly for a portion of the second substrate or a bonding agent, in particular, in said space between the first and second optical components, the top side of the first substrate and the top side of the second substrate are absent any part or component of the optical module, except possibly for a portion of the second substrate or a bonding agent.

In particular, said "part or component of the optical module" mentioned above may refer to a portion of a substrate of the optical module and/or to another optical component of the module. Possibly present bonding agents are not excluded from being present between the first and second optical components.

The invention also comprises optical modules with features of corresponding methods according to the invention, and, vice versa, the invention also comprises methods with features of corresponding optical modules according to the invention.

The invention also comprises wafer stacks; on the one hand a wafer stack comprising a plurality of optical modules according to the invention; on the other hand:

A wafer stack comprising
   a first substrate wafer on which a plurality of first optical components is present on a top side of the first substrate wafer;
   a second substrate wafer having a material region which is a continuous laterally defined region in which material of the second substrate is present, wherein a plurality of second optical components is present in said material region;

wherein the top side of the first substrate wafer faces a bottom side of the second substrate wafer with no further wafer in between, and wherein each of the first optical components is present in a laterally defined region not overlapping the material region.

The invention also comprises wafer stacks with features of corresponding methods or optical modules according to the invention, and, vice versa, the invention also comprises methods and optical modules with features of corresponding wafer stacks according to the invention.

And the invention comprises a device comprising an optical module according to the invention or an optical module manufactured using a method according to the invention.

In one embodiment, the device further comprises a printed circuit board on which the optical module is mounted.

The device can in particular be at least one of
   a portable or mobile computing device;
   a smart phone;
   a tablet computer;
   a digital reader;
   a photographic device;
   a digital camera;
   a game controller;
   a sensing device;
   a sensor.

Further embodiments and advantages emerge from the dependent claims and the figures.

Below, the invention is described in more detail by means of examples and the included drawings. The figures show schematically:

FIG. 1 a top view onto a detail of a wafer stack comprising a first and a second substrate wafer;

FIG. 2 a side view of a portion of an optical module obtainable from the wafer stack of FIG. 1;

FIG. 3 a cross-sectional view of a portion of an optical module obtainable from the wafer stack of FIG. 1;

FIG. 4 a side view of an optical module obtainable from a wafer stack comprising the wafer stack of FIG. 1;

FIG. 5 cross-sectional view of an optical module obtainable from a wafer stack comprising the wafer stack of FIG. 1;

FIG. 6 a top view onto a detail of a wafer stack comprising a first and a second substrate wafer;

FIG. 7 a side view of a portion of an optical module obtainable from the wafer stack of FIG. 6;

FIG. 8 a side view of an optical module obtainable from a wafer stack comprising the wafer stack of FIG. 6;

FIG. 9 a side view of an optical module obtainable from a wafer stack comprising the wafer stack of FIG. 6;

FIG. 10 a top view onto a detail of a wafer stack comprising a first and a second substrate wafer;

FIG. 11 a side view of a portion of an optical module obtainable from the wafer stack of FIG. 10;

FIG. 12 a side view of an optical module obtainable from a wafer stack comprising the wafer stack of FIG. 10;

FIG. 13 a side view of an optical module obtainable from a wafer stack comprising the wafer stack of FIG. 10;

FIG. 14 a cross-sectional view of a portion of an optical module comprising a first and a second substrate;

FIG. 15 a cross-sectional view of a portion of an optical module comprising a first and a second substrate;

FIG. 16 a cross-sectional view of a portion of an optical module comprising a first and a second substrate;

FIG. 17 a top view of a portion of an optical module for illustrating space requirements;

FIG. 18 a cross-sectional view of a portion of a wafer stack for illustrating space requirements;

FIG. 19 a cross-sectional view of a portion of a wafer stack for illustrating space requirements;

FIG. 20 a cross-sectional view of a portion of a wafer stack for illustrating space requirements;

FIG. 21 a cross-sectional view of a portion of a precursor of a second substrate wafer with a second optical component produced thereon;

FIG. 22 a cross-sectional view of the portion of a second substrate wafer of FIG. 21 with the second optical component thereon, for illustrating creation of an opening with simultaneous removal of a portion of a surrounding portion of the second optical component;

FIG. 23 a cross-sectional view of a portion of an optical module comprising the portion of a second substrate wafer of with the second optical component produced thereon of FIG. 22;

FIG. 24 a cross-sectional view of a portion of an optical module with a second substrate establishing undercuts;

FIG. 25 a cross-sectional view of a portion of an optical module including a conductor path.

The described embodiments are meant as examples and shall not limit the invention.

FIG. 1 shows schematically a top view onto a detail of a wafer stack W comprising a first substrate wafer S1 and a second substrate wafer S2. FIG. 2 is a schematic side view of a portion of an optical module M obtainable from the wafer stack of FIG. 1. And FIG. 3 is a schematic cross-sectional view of a portion of an optical module M obtainable from the wafer stack of FIG. 1. The approximate location of the cross-section is indicated in FIG. 1 by the dashed line and the open arrow.

The outer arrows in FIGS. 1, 6 and 10 indicate separation lines, also referred to as dicing lines which are also drawn in the respective Figures.

The wafer portions in an optical module obtained by separating a wafer stack are referenced with the reference signs of the respective wafer. Those wafer portions are also referred to as substrates (in case of substrate wafers) or as spacers (in case of spacer wafers).

On wafer S1, an optical component C1 is present, whereas on wafer S2, an optical component C2 is present. The wafers S1, S2 are interconnected, e.g., by bonding them to each other, e.g., using an adhesive. A top face of wafer S1 faces and, in the illustrated case, even is in touch with a bottom surface of wafer S2, wherein a bonding agent may be present between them. In order to provide space for optical component C1, an opening 50, more specifically a through-hole, is provided in wafer S2. Optical component C1 (or at least a portion thereof) is laterally surrounded by material of wafer S2. Optical component C1 protrudes into opening 50.

Wafers S1 and S2 can be manufactured separately, and before forming a wafer stack W comprising them, they can be provided with the respective optical components C1, C2.

FIG. 4 is a schematic side view of an optical module M obtainable from a wafer stack comprising the wafer stack W of FIG. 1. FIG. 5 is a schematic cross-sectional view of the optical module M of FIG. 4. In this case, two further wafers, namely another substrate wafer S3 and also a spacer wafer P1, were provided (and stacked upon wafers S1, S2) before separating the wafer stack into a plurality of optical modules M. Substrate S3 usually comprises at least one optical element C3, and in the example of FIGS. 4 and 5, it comprises two optical elements C3, C3'.

Spacer wafer P1 vertically extends from wafer S2 (more precisely from a top side of wafer S2) to wafer S3 (more precisely to a bottom side of wafer S3) and thus defines their mutual vertical distance, wherein bonding agents may be present, too.

Furthermore, spacer wafer P1 has an opening 55 or, more specifically a through hole, in which optical component C2 is present. More particularly, optical component C2 (or at least a portion thereof) is laterally surrounded by spacer wafer P1. Also optical component C3' is present inside opening 55.

A folded optical path for light can be defined by the optical components C1, C2, C3, C3'.

Component C1 can be, e.g., a light detector such as a photo diode or an image sensor.

Component C2 can be, e.g., a mirror or a grating.

Component C3 can be, e.g., a lens or lens element.

Component C3' can be, e.g., a curved mirror or a curved grating.

It is possible to provide that no optical component is present at such a side of one of the wafers, which, after separation into singularized optical modules, is an outer side of an optical module. In particular, the top side of a top-most wafer and the bottom side of a bottom-most wafer such as, in the example of FIGS. 4 and 5, of wafers S1 and S3, respectively, can be free from optical components. E.g., referring to FIGS. 4, 5, optical component C3 could either be not present at all or be arranged inside opening 55. Such optical modules can be particularly robust.

It is to be noted that it can be provided that a housing of an optical module M is established mainly or even completely by wafer sections of the module, i.e. by substrates and/or spacers of the module. Such an optical module can furthermore be hermetically closed.

In the example of FIGS. 4, 5, the housing is substantially established by sections of the wafers S1, S2, S3 and P1.

It can be provided, as illustrated in the example of FIGS. 1 to 5 that wafer S2 extends through all dicing lines and/or has openings 5 (or open portions) only outside separation lines. E.g., wafer S2 has openings only for optical components present on wafer S1, and those openings fully laterally surround those optical components (such as optical component C1 in FIG. 1), in particular in each optical module M.

Such a substrate S2 can have rather high mechanical stability, but it consists of a relatively large amount of material.

FIGS. 6 and 7 and also FIGS. 10 and 11 illustrate examples for substrate wafers S2 which laterally occupy relatively little space and which consist of a relatively small amounts of material (compared to the example of FIG. 1).

FIG. 6 is a schematic top view onto a detail of a wafer stack W comprising first and second substrate wafers S1, S2. FIG. 7 is a side view of a portion of an optical module M obtainable from the wafer stack of FIG. 6.

Wafer S2 of FIG. 6 has more openings than merely one opening 50 per optical component. And only one of these openings 50 surrounds optical component C1, and this not in full, but merely in part.

FIGS. 8 and 9 are schematic side views of optical modules obtainable from a wafer stack comprising the wafer stack of FIG. 6. Similarly to the case illustrated in FIG. 4, a spacer wafer P1 and a third substrate wafer S3 is provided.

The spacer wafer P1 could, like in the case of FIG. 4, sit on substrate wafer S2 and extend to wafer S3. But considering the shape of wafer S2, cf. FIG. 6, this might result in low mechanical stability. Thus, spacer wafer P1 can either rest on both, wafers S1 and wafer S2, as illustrated in FIG. 8, or rest on wafer S1 only, as illustrated in FIG. 9.

Figure 1:
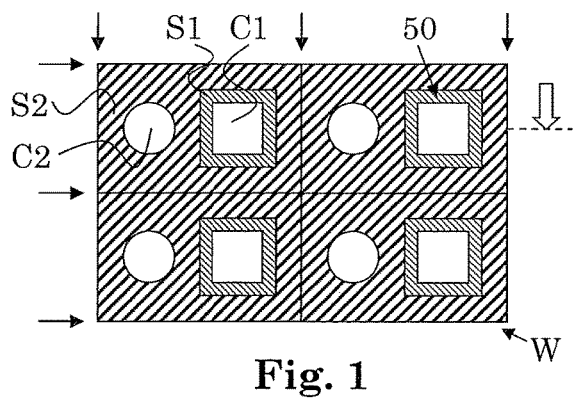
Figure 2:
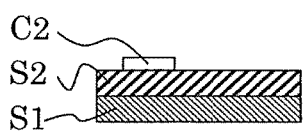
Figure 3:
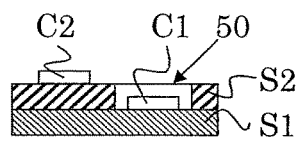
Figure 4:
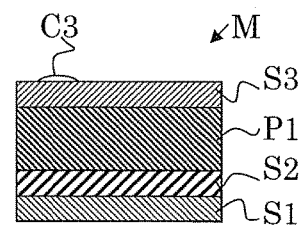
Figure 5:
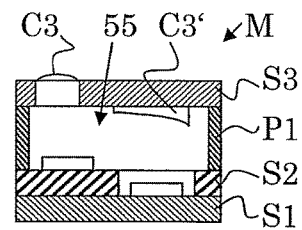
Figure 6:
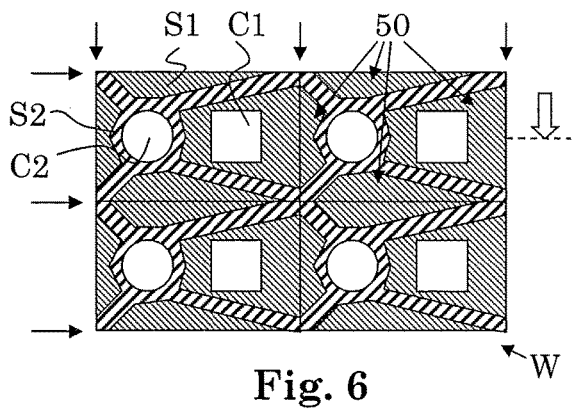
Figure 9:
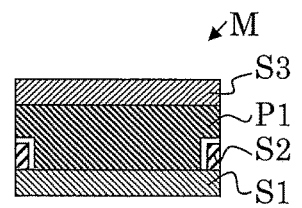
Figure 7:
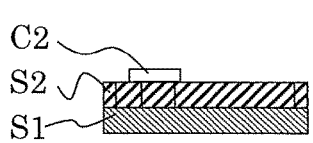
Figure 8:
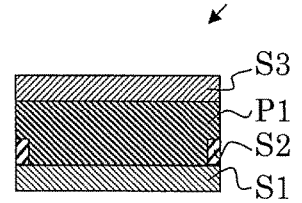
Figure 10:
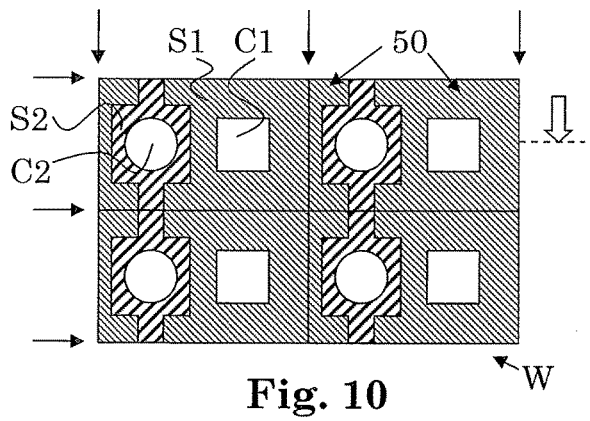
FIG. 10 is a schematic top view onto a detail of a wafer stack W comprising first and second substrate wafers S1, S2.
Figure 13:
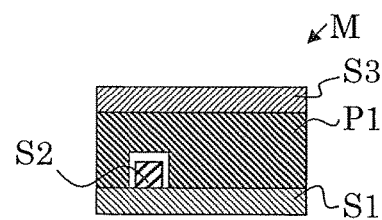
FIGS. 12 and 13 are a schematic side views of optical modules obtainable from a wafer stack comprising the wafer stack of FIG. 10. Similarly to the case illustrated in FIG. 4 and to FIGS. 8 and 9, a spacer wafer P1 and a third substrate wafer S3 is provided.
Figure 11:
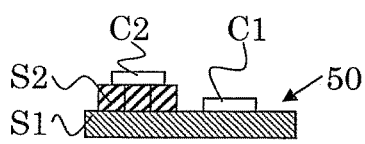
FIG. 11 is a side view of a portion of an optical module obtainable from the wafer stack of FIG. 10.
Figure 12:
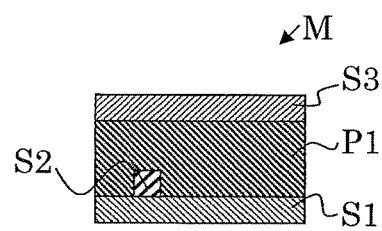

The spacer wafer P1 could, like in the case of FIG. 4, sit on substrate wafer S2 and extend to wafer S3. But considering the shape of wafer S2, cf. FIG. 10, this would result in low mechanical stability. Thus, spacer wafer P1 can either rest on both, wafer S1 and wafer S2, as illustrated in FIG. 12, or rest on wafer S1 only, as illustrated in FIG. 13.

Figure 14:
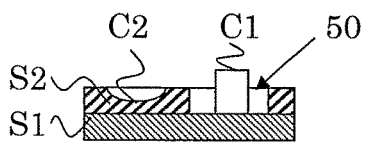
Figure 15:
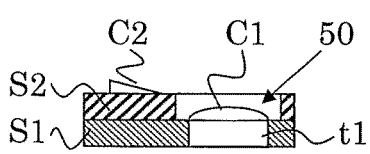
Figure 16:
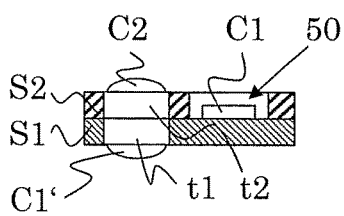

FIGS. 14 to 16 schematically show cross-sectional views of portions of optical modules comprising a first and a second substrate S1, S2. These Figures mainly shall illustrate different types and locations (positions) of optical components C1, C2 as well as other possible features. The described properties and features can be applied or provided independently, i.e. they are not bound to being combined in the illustrated ways.

FIG. 14 illustrates an optical component C2 which is integrated in substrate S2. And it also illustrates an optical component C2 which is present between a top surface and a bottom surface of substrate S2. Furthermore, FIG. 14 illustrates an example for a reflective optical component C2, C2 being, e.g., a curved mirror.

In addition, FIG. 14 illustrates an optical component C1 which extends or protrudes through opening 50 in substrate S2.

FIG. 15 illustrates an example for a transmissive optical component C1. And it illustrates an example in which optical component C1 is a passive optical component, such as the illustrated lens element.

Furthermore, FIG. 15 illustrates an example in which substrate S1 has a transparent portion t1 which may be an opening or rather be made of a transparent solid material such as glass or a transparent polymer.

FIG. 16 illustrates an example in which substrate S1 has a transparent portion t1 and in addition, wafer S2 has a transparent portion t2 laterally aligned thereto.

FIG. 16 also illustrates an example for a transmissive optical component C2. And it illustrates an example in which optical component C2 is a passive optical component, such as the illustrated lens element.

Furthermore, FIG. 16 illustrates an example for the possibility to provide, on substrate S1, more particularly on a bottom side thereof, another optical component C1'.

Figure 17:
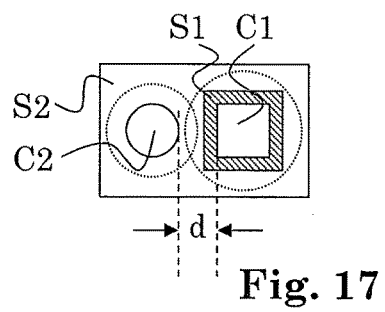

FIG. 17 is a schematical a top view onto a portion of an optical module for illustrating space requirements. Second optical component C2 has a lateral distance d to first optical component C1. By firstly providing first and second substrate wafers S1, S2 with the first and second optical components C1, C2, respectively, and then interconnecting the first and second substrate wafers S1, S2, it can be possible to achieve distances d which are smaller than distances achievable in case the first and/or second optical components were produced together with or produced on or attached to the respective wafers after interconnecting the wafers S1, S2. And it can be possible to achieve distances d which are smaller than distances achievable in case the first and second optical components were produced together with or produced on or attached to a single wafer.

This can be due to space requirement of processes used. In FIG. 17, dotted circles around optical components C1 and C2, respectively, very schematically illustrate such space requirement or more precisely a lateral component of such space requirements. Space requirements may have various three-dimensional shapes, e.g., may be of different size in different lateral direction and may be different in different vertical planes.

Space requirements may be due, e.g., to tolerance of the respective process and to space occupied by tools used during the respective process.

The fact that the circles in FIG. 17 are overlapping indicates that it would not be possible to simultaneously provide optical components C1 and C2 on their respective substrate wafers S1, S2 while the wafers are interconnected. The fact that the circles overlap in FIG. 17 may furthermore be taken as an indication that it would not be possible to simultaneously provide optical components C1 and C2 on one single substrate wafer.

Figure 18:
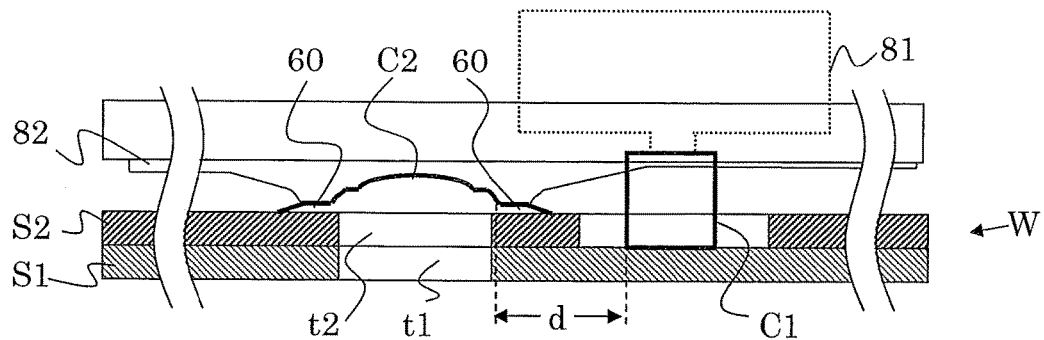
Figure 19:
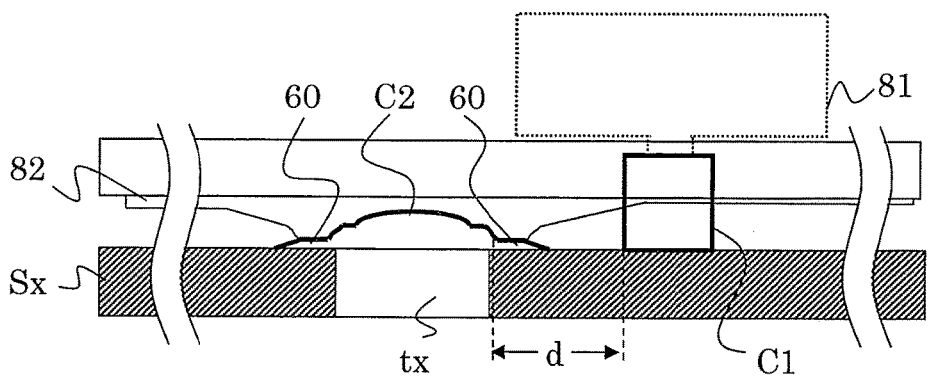
Figure 20:
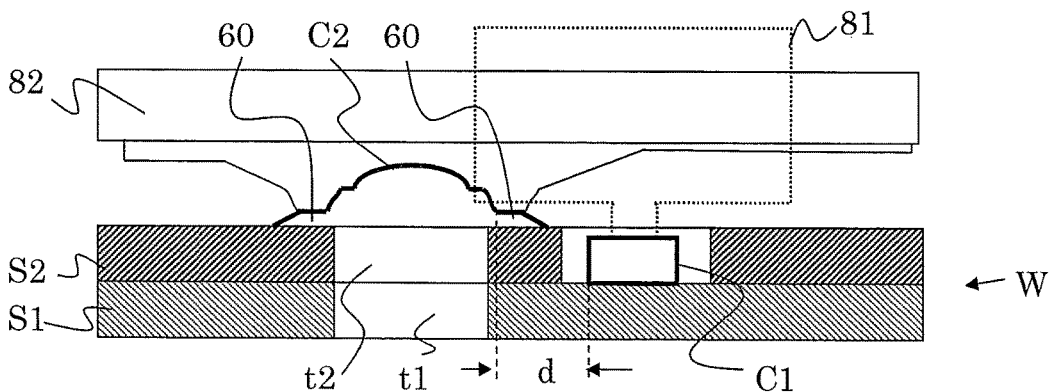

FIGS. 18 to 20 are schematical cross-sectional views of a portion of a wafer stack W for illustrating space requirements.

In FIGS. 18 to 20, it is assumed that optical components C1 are placed on the respective substrate wafer (S1 in FIGS. 18 and 20, Sx in FIG. 19) using a pick-and-place machine, whereas optical components C2 are produced on the respective substrate wafer (S2 in FIGS. 18 and 20, Sx in FIG. 19) using a replication technique, namely embossing. A pick-and-place tool is illustrated in dotted lines and referenced 81, whereas a replication tool is illustrated in thin lines and referenced 82.

FIGS. 18 to 20 show second optical components C2 which are continuous with a surrounding portion 60 laterally surrounding the respective second optical component C2. Such surrounding portions 60 can be due to the way of manufacturing the second optical components, as can be inferred from the exemplary cases illustrated in FIGS. 18 to 20. The lateral distance d between the optical components C1, C2 is illustrated in FIGS. 18 to 20. In FIGS. 18 to 20, the provision of surrounding portions 60 is optional, whereas in FIGS. 21 to 23 (cf. below), it is not.

As is apparent from FIG. 18, tools 81 and 82 cannot be used simultaneously (on the interconnected wafers S1, S2). The space occupied by them would overlap, making this impossible. As can also be seen in FIG. 18, it is also not possible to use tool 82 after substrate wafer S1 has been interconnected with wafer S2 and has been provided with the first optical components C1. The space required for tool 81 would overlap with the space taken by the optical components C1, making this impossible.

But it might be possible to use tool 81 for providing substrate S1 with optical components C1 after wafers S1 and S2 have been interconnected and wafer S2 has been provided with optical components C2. However, process tolerances (which are not illustrated in FIG. 18) might render this way of proceeding impossible, too.

Yet, it is possible to provide wafer S1 with optical components C1 and to provide wafer S2 with optical components C2 first, and then to interconnect the wafers in order to establish the illustrated wafer stack W.

FIG. 19 illustrates that it can be meaningful to make use of a reference to a single (quasi virtual) wafer, referred to as Sx, when describing a nearness of optical components or their distance. Wafer Sx comprises a transparent portion tx.

In case it would have been initially planned to have first and second optical components C1, C2 on one single wafer such as the illustrated wafer Sx, this task might turn out to be impossible (provided that the processes for the optical components are preset), at least, as in the illustrated case of FIG. 19, in case optical components C1 would have to be attached to wafer Sx before optical components C2 are processed—wherein process tolerances might make this way of proceeding impossible, too.

As is apparent from FIG. 19, a "collision" between tool 82 and optical components C1 would preclude providing substrate Sx with optical components C1 first and then with optical components C2. And a simultaneous provision of wafer Sx with both, optical components C1, C2, would also be impossible.

The use of two initially separate wafers S1, S2 which are provided with the respective optical components C1, C2 prior to interconnecting the wafers S1, S2 can solve this problem, as can be inferred from FIG. 18.

FIG. 20 illustrates, in a similar way as FIG. 18, possibilities provided when interconnecting wafers S1, S2 only after they have been provided with the respective optical components C1, C2.

In the example of FIG. 20, it is obviously not possible to simultaneously provide on or at a wafer stack W comprising the wafers S1, S2 the respective optical components C1, C2.

And it is also not possible to provide optical components C1 after optical components C2 have been provided and the wafer stack W comprising wafers S1 and S2 has been established. This is apparent from tool 81 overlapping with optical component C2 in the illustration of FIG. 20.

Even though in the case illustrated in FIG. 20 the spaces occupied by the optical components C1, C2 and by the tools 81, 82 apparently do not preclude to replicate optical components C2 (including their surrounding portions 60) on a wafer stack in which spacer C1 is already provided with optical components C1, it can well be assumed that process tolerances (not illustrated in FIG. 20) of the replication process in which wafer S2 is provided with optical components C2 preclude also this way of proceeding.

However, the suggested way of proceeding by interconnecting the wafers S1, S2 only after optical components C1, C2 have been provided at their respective wafer, makes possible to successfully manufacture the illustrated wafer stack (and optical modules finally originating therefrom).

Figure 21:
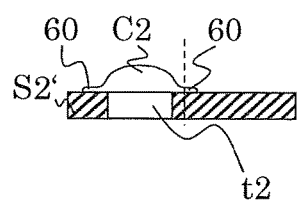

FIG. 21 is a schematized cross-sectional view of a portion of a precursor S2' of a second substrate wafer with a second optical component S2 thereon. Second optical component C2 is continuous with a surrounding portion 60 laterally surrounding the it. Surrounding portion 60 does not a any or at least has no desired optical function.

As has been illustrated in FIG. 18, have surrounding portion 60 may arise from the way optical component C2 is manufactured.

Since surrounding portion 60 can be dispensed with, it can be removed, at least in part. This may allow to make possible a particularly mutually laterally close positioning of optical components C1, C2.

The vertical dashed line in FIG. 21 illustrates where material is removed simultaneously from the surrounding portion 60 and from the precursor S2', e.g., by dicing or laser cutting.

Figure 22:
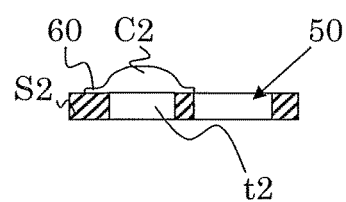

It is possible to remove at least a portion of surrounding portion 60 during establishing opening 50 in the precursor S2', so as to obtain substrate S2 as illustrated in FIG. 22.

Figure 23:
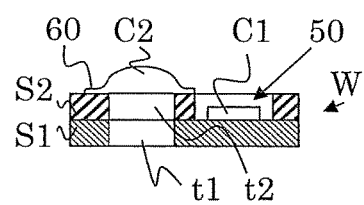

With opening 50 created in substrate wafer S2, a wafer stack W can be formed by interconnecting wafer S2 with a wafer S1 on which optical components C1 are present. FIG. 23 is a schematical cross-sectional view of a portion of an optical module comprising the portion of a second substrate wafer S2 of with the second optical component C2 produced thereon illustrated in FIG. 22, i.e. of a portion of said wafer stack W.

Figure 24:
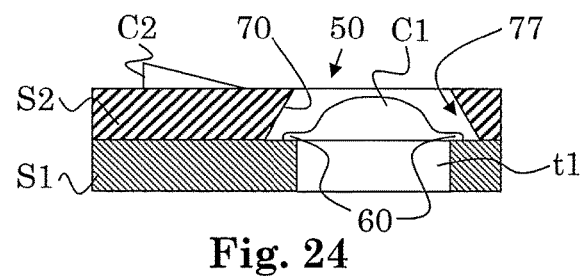

FIG. 24 is a schematical cross-sectional view of a portion of an optical module with a second substrate S2 establishing undercuts 77. Cutting lines 70 visible in a profile as illustrated may originate from creating an opening 50 in a substrate wafer S2 and are at an angle with the vertical. Such openings with inclined sidewalls can be produced, e.g., using micromachining or laser cutting.

This can be particularly useful in case of optical components C1 tapering (reducing) in a direction pointing from the first substrate S1 to the second substrate S2. This can be the case, e.g., if optical component C1 is manufactured using a replication technique and/or has a surrounding portion 60 as described above.

Providing such undercuts 77 and/or corresponding cutting lines 70 can make possible to have optical components particularly close to each other (laterally).

Figure 25:
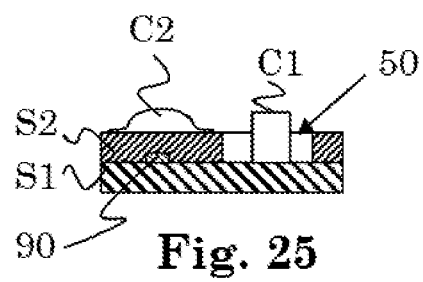

FIG. 25 illustrates an example of a module in which at least one conductor path 90 is present on the top side of the first substrate S1 in the material region of the second substrate S2. The illustrated conductor path 90 is in a laterally defined region occupied by the second optical component C2.

It is noted that in order to make possible a particularly close mutual arrangement of first and second optical components, the space between neighboring first and second optical components of an optical module is free, i.e. is absent further parts or portions of the optical module, as is also in most of the illustrated examples, except for portions of the second substrate and/or a bonding agent possibly present there. However, in cases where first and second optical components may be spaced apart sufficiently far, it can be provided that another optical component or a portion of another substrate or spacer of the optical module may be present in the space between neighboring first and second optical components of an optical module.

The invention claimed is:

1. An optical module comprising:
   a first substrate having a top side on which a first active optical component is present;
   a second substrate having a bottom side;
   wherein the first substrate and the second substrate are interconnected such that the top side of the first substrate faces the bottom side of the second substrate with no further substrate in between the first and second substrates, and the second substrate is stacked onto the first substrate;
   wherein the second substrate has
      a material region which is a laterally defined region in which material of the second substrate is present and having a top side on which a second passive optical component is present, the top side of the material region being on a side of the second substrate opposite that of the bottom side of the second substrate; and
      at least one open region which is a laterally defined region in which no material of the second substrate is present;
   wherein at least a portion of the first active optical component is laterally located within the at least one open region.

2. The optical module according to claim 1, wherein the first active optical component is laterally positioned in a first region and the second passive optical component is laterally positioned in a second region, wherein the first region and the second region do not overlap.

3. The optical module according to claim 1, wherein the first active optical component is arranged such that it vertically extends beyond the bottom side of the second substrate.

4. The optical module according to claim 1, wherein the first active optical component is surrounded by a boundary between the material region and the at least one open region.

5. The optical module according to claim 1, further comprising a third substrate and a first spacer, wherein the first spacer is present between the first substrate and the third substrate.

6. The optical module according to claim 1, comprising a second spacer, the second spacer extending from a top side of the second substrate opposite to the bottom side of the second substrate into a direction opposite to a direction pointing from the bottom side of the second substrate to the top side of the first substrate.

7. The optical module according to claim 5, comprising a second spacer, the second spacer extending from a top side of the second substrate opposite to the bottom side of the second substrate into a direction opposite to a direction pointing from the bottom side of the second substrate to the top side of the first substrate, the second spacer being at a distance from the third substrate.

8. The optical module according to claim 1, wherein at least one conductor path is present on the top side of the first substrate in the material region.

9. The optical module according to claim 1, wherein no part or component of the optical module is present between the first and the second optical components.

10. The optical module according to claim 1, wherein the second substrate is structured in such a way that an undercut between the second substrate and the top side of the first substrate is established.

11. The optical module according to claim 1, wherein a lateral distance between the first active optical component and the second passive optical component is smaller than 800 μm.

12. A wafer stack comprising a plurality of optical modules according to claim 1.

13. A wafer stack comprising:
a first substrate wafer on which a plurality of first active optical components is present on a top side of the first substrate wafer;
a second substrate wafer having one or more openings and a material region which is a continuous laterally defined region in which material of the second substrate is present, wherein a plurality of second passive optical components is present on a top side of said material region;
wherein the top side of the first substrate wafer faces a bottom side of the second substrate wafer with no further wafer in between, and wherein at least a portion of each first active optical component of the plurality of first active optical components is present in a respective one of the one or more openings.

14. A device comprising the optical module according to claim 1, further comprising a printed circuit board on which the optical module is mounted.

15. A device comprising the optical module according to claim 1, wherein the device is at least one of
a portable or mobile computing device;
a smart phone;
a tablet computer;
a digital reader;
a photographic device;
a digital camera;
a game controller;
a sensing device;
a sensor.

16. The optical module according to claim 5, wherein the first spacer is present between the second substrate and the third substrate.

17. The optical module according to claim 1, wherein the first active optical component is projecting into or through the at least one open region.

18. The optical module according to claim 1, wherein the first active optical component protrudes into the at least one open region of the second substrate and extends beyond the top side of the second substrate.

19. The optical module according to claim 5, wherein the first spacer is continuous with the third substrate.

20. The optical module according to claim 6, wherein the second spacer is continuous with the second substrate.

21. The optical module according to claim 8, wherein at least one conductor path is present in a laterally defined region occupied by the second passive component.

22. The wafer stack according to claim 13, wherein each first active optical component of the plurality of first active optical components protrudes from the top side of the first substrate wafer beyond a top side of the second substrate wafer.

23. The wafer stack according to claim 13, wherein the second substrate wafer has a multitude of openings, and each first active optical component of the plurality of first active optical components projects into or through a respective one of the one or more openings.

24. The wafer stack according to claim 13, wherein each first active optical component of the plurality of first active optical components protudes into a respective one of the one or more openings of the second substrate and extends beyond the top side of the second substrate.

25. The optical module according to claim 1, wherein no part or component of the optical module is present between the first and the second optical components other than one or more of the following:
a portion of the second substrate;
a bonding agent on the top side of the first substrate.

26. The optical module according to claim 1 wherein the first and second substrates are bonded directly to one another.

27. The optical module according to claim 1 wherein the first and second substrates are bonded directly to one another only by adhesive.

28. The optical module of claim 1 wherein the second passive optical component is a reflective optical component.

29. The optical module of claim 1 wherein the second passive optical component is a curved mirror.

30. The wafer stack of claim 13 wherein each of the second passive optical components is a reflective optical component.

31. The wafer stack of claim 13 wherein each of the second passive optical components is a curved mirror.

* * * * *